United States Patent [19]

Shaffer et al.

[11] Patent Number: 5,561,765
[45] Date of Patent: Oct. 1, 1996

[54] ALGORITHM FOR TESTING A MEMORY

[75] Inventors: Shmuel Shaffer; David Weiss, both of Palo Alto, Calif.

[73] Assignee: Siemens Rolm Communications, Inc., Santa Clara, Calif.

[21] Appl. No.: 281,050

[22] Filed: Jul. 27, 1994

[51] Int. Cl.$^6$ ............................. G06F 11/00; G11C 7/00
[52] U.S. Cl. ........................ 395/183.18; 365/201
[58] Field of Search .................... 371/21.1, 21.2, 371/51.1, 53, 54, 49.1, 49.2; 365/200, 201, 183.18; 395/183.18

[56] References Cited

U.S. PATENT DOCUMENTS

| | | | |
|---|---|---|---|
| 4,872,168 | 10/1989 | Aadson et al. | 371/21.3 |
| 5,033,048 | 7/1991 | Pierce et al. | 371/21.2 |
| 5,247,524 | 9/1993 | Callon | 371/53 |
| 5,313,475 | 5/1994 | Cromer et al. | 371/40.1 |

*Primary Examiner*—Robert W. Beausoliel, Jr.
*Assistant Examiner*—Norman M. Wright

[57] ABSTRACT

A method for generating test data for testing a memory having k data bits and n address bits, where n is less than or equal to 2 times k. For each address location for which test data is desired, the address bits for the location are combined to form the test data for the location. First, two mutually-exclusive groups of n minus k non-repeating bits of the address word are selected. Second, the two groups of address bits are combined using an exclusive-OR operation. Third, the results of the exclusive-OR operation are combined with any remaining bits of the address word to form the test data for the address location. For example, in one embodiment, the most significant n minus k bits of the least significant k bits of the address word are combined, via an exclusive-OR operation, with the most significant n minus k bits of the address word. The resulting data is then concatenated with the remaining bits of the address word.

7 Claims, 3 Drawing Sheets

ALGORITHM FOR TESTING A MEMORY

FIELD OF THE INVENTION

This invention relates generally to testing. Specifically, the invention relates to algorithms for error detection in memories.

BACKGROUND OF THE INVENTION

Parity bits are commonly used to verify that a memory is working properly. By adding the extra bit or bits to a data word, the data can be verified (and, in certain instances corrected) by using the formula that initially generated the bits.

Generally speaking, parity is useful for checking data. However, if one also wishes to check for errors in the addressing circuitry, more is needed. For example, if the processor issues a command to address a particular location in memory and, as a result of a hardware error, a different location is addressed, a parity check will not reveal the error if the data is otherwise correct. Address errors may arise from defects in such components as the address bus and the address decoders.

One solution to this problem is to write unique data patterns into each location in the memory, such that no two locations contain the same pattern. Upon reading the data, if an erroneous pattern is detected, it can be concluded that the error exists either in the data or the address or both. A typical data pattern is the actual address of the accessed location, i.e., the data 00101 would be written in memory location 00101. To verify both polarities of data errors, such as stuck-at-0 and stuck-at-1, the one's complement of the address can be written to memory in a second pass.

The approach outlined above is satisfactory where the bit-length of the data word (or other data unit) is equal to or greater than that of the address. If they are equal, the data simply becomes the value of the address. In the event the data word is larger, additional dummy bits can be added to the address to compose a suitable data word.

However, where the bit-length of the address is greater than that of the data, the data word can no longer be unique with respect to each address. This latter situation is common in many of the popular microprocessors in use today, e.g., the 80X86 and the 680X0 families of microprocessors, where the bit-length of the address can be as much as twice that of the data. For example, as shown in FIG. 1, if the data has a bit-length of 3 (yielding 8 possible combinations) and the address has a bit-length of 5 (resulting in 32 possible addressable locations), the three-bit data patterns will repeat four times, resulting in four otherwise identical segments. If there is an error in the addressing circuitry, causing the memory to read from a different segment, the data may nevertheless appear correct as it would otherwise be the same. Thus, in order to detect an addressing error, it is necessary to distinguish between the data in the four segments.

Therefore, it would be desirable to provide a method of generating data that can assist in detecting errors in both the data and the address in memories where the address bit-length is greater than the data word bit-length.

SUMMARY OF THE INVENTION

These and other objects are achieved by an algorithm and a method of data generation that permits one to detect errors in the data or the address path where the bit-length of the address exceeds the bit-length of the data word by as much as a factor of two.

The algorithm generates a data word derived from the individual bits of the address word. In one version of the algorithm, where the address bit-length is n and the data bit-length is k, the n–k most significant bits of the address word are exclusive-ORed with the next n–k most significant bits of the address word. The resulting n–k bits are combined or concatenated with the remaining 2k–n bits to form a data word having a bit length of k bits. The data is then written to the entire memory (or, if preferred, a portion thereof) and subsequently read back to check for accuracy. Since the data word is derived from the address, the system knows what to expect upon reading the previously written-to address. If an error occurs, further writing and reading can be performed to pinpoint the source of the error.

In variations of this algorithm, the exclusive-OR pairings can be modified, the order of concatenation of the bits can be varied, and the length of the exclusive-OR pairings can be increased beyond n–k up to the largest whole number not exceeding n÷2.

BRIEF DESCRIPTION OF THE DRAWINGS

A more complete understanding of the present invention, as well as other objects and advantages thereof not enumerated herein, will become apparent upon consideration of the following detailed description and the accompanying drawings.

DETAILED DESCRIPTION OF THE INVENTION

Figure 1:
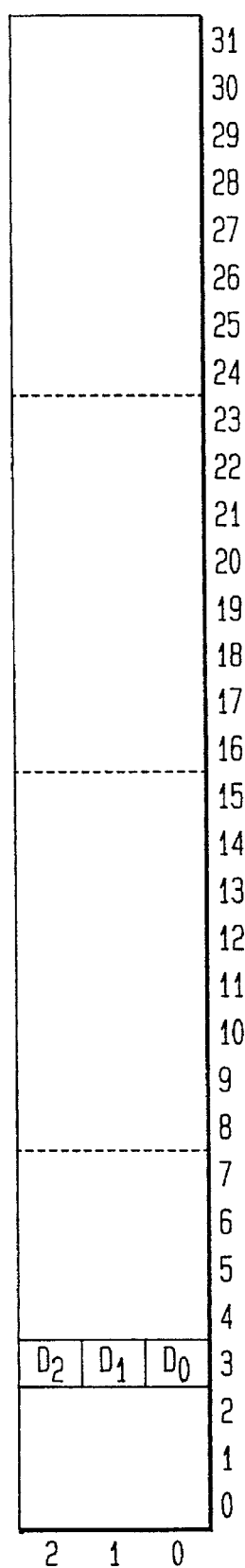
FIG. 1 is a block diagram of a memory illustrating the locations in the memory and their respective addresses.
Figure 2:
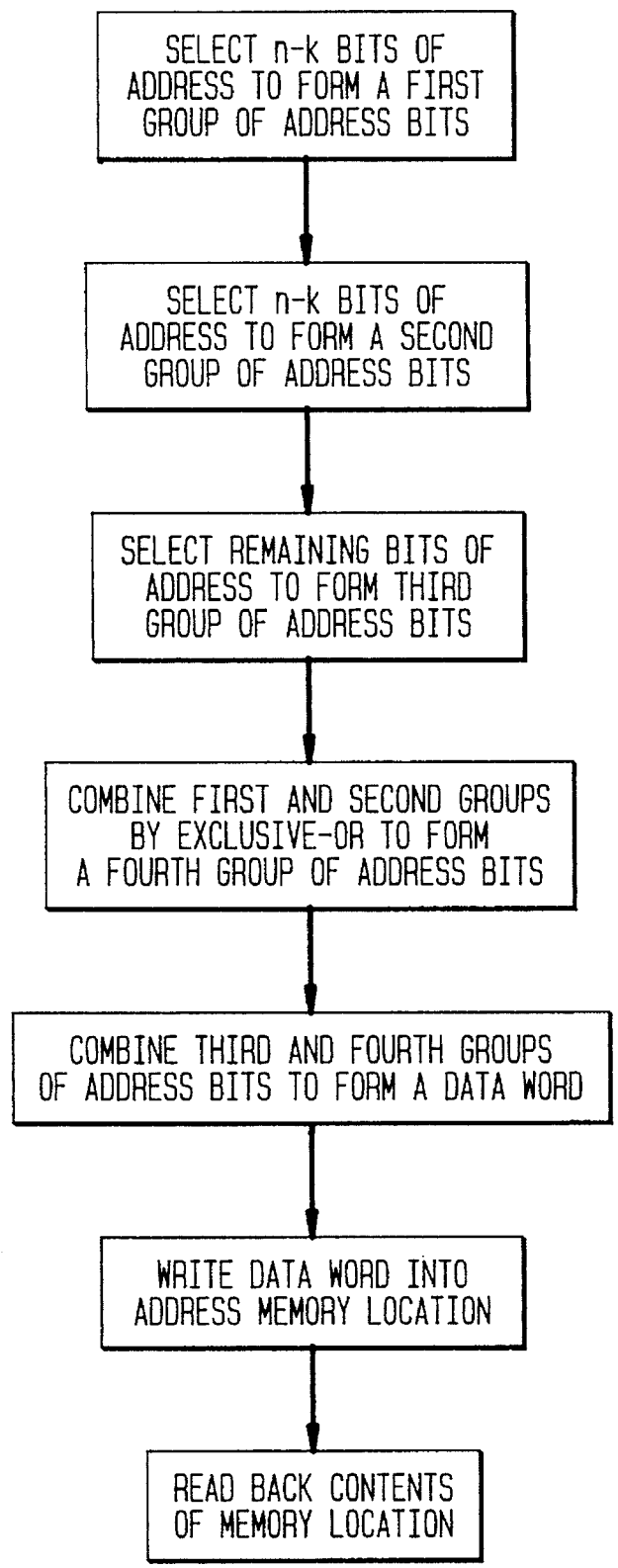
FIG. 2 is a flow chart illustrating steps of a method of the invention.
Figure 3:
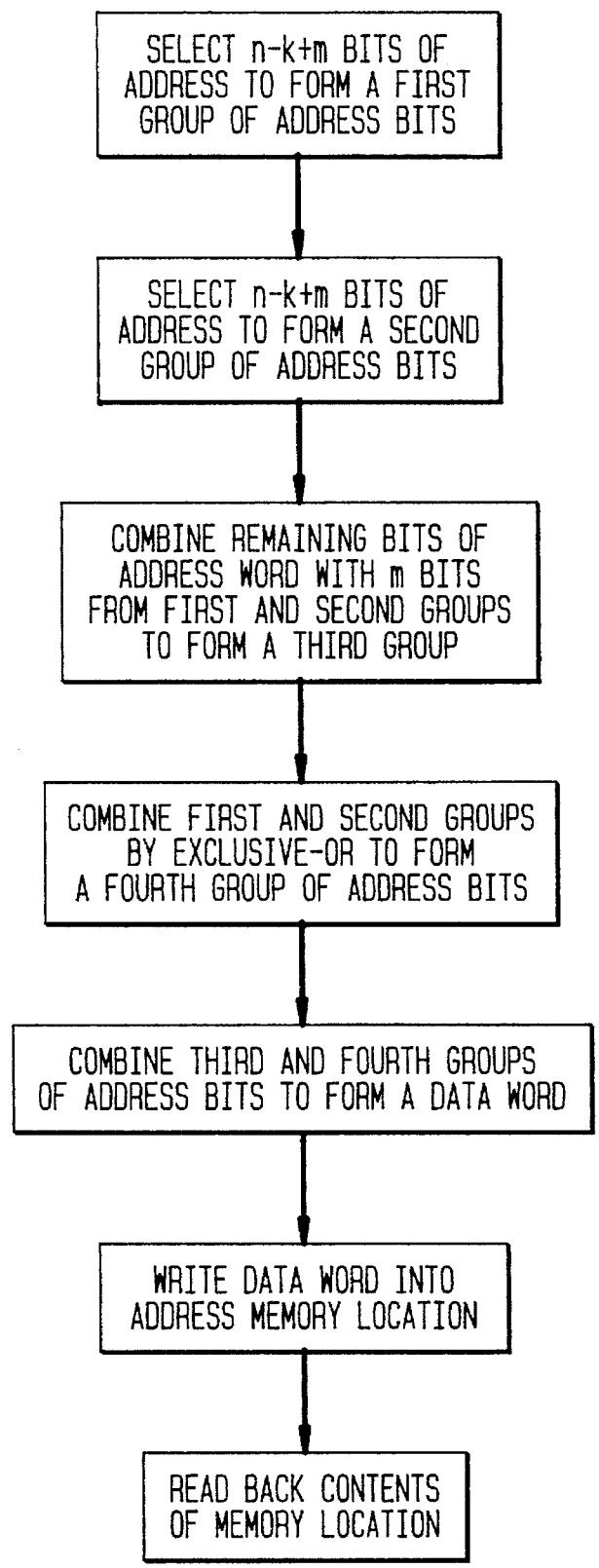
FIG. 3 is a flow chart illustrating steps of an alternative method of the invention.

The algorithm described here can be used with a memory having data words k bits in length and addresses having a length of n bits, where n is greater than k, but less than or equal to twice the value of k. It should be understood that the algorithm can be implemented through software, hardware, or a combination of the two. As noted previously, k=3 and n=5 in the example shown in FIG. 1.

The data word D can be represented as $[D_{k-1}, D_{k-2}, \ldots, D_0]$, where $D_0$ is the least significant bit of the data word, and the address word can be represented as $[A_{n-1}, A_{n-2}, \ldots, A_0]$, where $A_0$ is the least significant bit of the address word. The bit-length of the address word exceeds the bit-length of the data word by n–k bits, and the number of addressable locations exceeds the number of unique values of data by a factor of $2^{n-k}$.

For the case where n<2k, the data word D is the combination or concatenation of the words $D_A$ and $D_B$, or $D=D_A:D_B$, and has k bits, where $$D_A = [D_{k-1}, D_{k-2}, \ldots, D_{2k-n}]$$

and $$D_B = [D_{2k-n-1}, D_{2k-n-2}, \ldots, D_0]$$

Therefore, $$D = [D_{k-1}, D_{k-2}, \ldots, D_{2k-n}]:[D_{2k-n-1}, D_{2k-n-2}, \ldots, D_0],$$

or $$D = [D_{k-1}, D_{k-2}, \ldots, D_{2k-n}, D_{2k-n-1}, D_{2k-n-2}, \ldots, D_0]$$

In one version of the algorithm, the two parts of the data word, $D_A$ and $D_B$, are derived as follows:

$$D_A = [A_{k-1}, A_{k-2}, \ldots, A_{2k-n}] \oplus [A_{n-1}, A_{n-2}, \ldots, A_k]$$

and $$D_B = [A_{2k-n-1}, A_{2k-n-2}, \ldots, A_0],$$

where $\oplus$ is the bit-wise exclusive-OR product of the corresponding bits in each array. (Note that either portion of $D_A$ could be reversed, i.e., $[A_{2k-n}, A_{2k-n+1}, \ldots, A_{k-2}, A_{k-1}]$ or $[A_k, A_{k+1}, \ldots, A_{n-2}, A_{n-1}]$.) Continuing, $$D_A = [A_{k-1} \oplus A_{n-1}, A_{k-2} \oplus A_{n-2}, \ldots, A_{2k-n} \oplus A_k]$$

Adding $D_B$, $$D = [A_{k-1} \oplus A_{n-1}, A_{k-2} \oplus A_{n-2}, \ldots, A_{2k-n} \oplus A_k]:[A_{2k-n-1}, A_{2k-n-2}, \ldots, A_0]$$

or $$D = [A_{k-1} \oplus A_{n-1}, A_{k-2} \oplus A_{n-2}, \ldots, A_{2k-n} \oplus A_k, A_{2k-n-1}, A_{2k-n-2}, \ldots, A_0]$$

For example, assume that k=8 and n=13. Then $$D_A = [A_7, A_6, \ldots, A_3] \oplus [A_{12}, A_{11}, \ldots, A_8]$$

or $$D_A = [A_7 \oplus A_{12}, A_6 \oplus A_{11}, A_5 \oplus A_{10}, A_4 \oplus A_9, A_3 \oplus A_8]$$

and $$D_B = [A_2, A_1, A_0]$$

Therefore, since $D = D_A:D_B$, $$D = [A_7 \oplus A_{12}, A_6 \oplus A_{11}, A_5 \oplus A_{10}, A_4 \oplus A_9, A_3 \oplus A_8]:[A_2, A_1, A_0]$$

or $$D = [A_7 \oplus A_{12}, A_6 \oplus A_{11}, A_5 \oplus A_{10}, A_4 \oplus A_9, A_3 \oplus A_8, A_2, A_1, A_0]$$

For the case where n=2k, the data word D is simply $D_A$, or $$D = D_A = [A_{k-1}, A_{k-2}, \ldots, A_{2k-n}] \oplus [A_{n-1}, A_{n-2}, \ldots, A_k]$$

or $$D = D_A = [A_{k-1} \oplus A_{n-1}, A_{k-2} \oplus A_{n-2}, \ldots, A_{2k-n} \oplus A_k]$$

Therefore, if k=8 and n=16, $$D = [A_7 \oplus A_{15}, A_6 \oplus A_{14}, A_5 \oplus A_{13}, A_4 \oplus A_{12}, A_3 \oplus A_{11}, A_2 \oplus A_{10}, A_1 \oplus A_9, A_0 \oplus A_8]$$

In the examples shown above, $D_A$ is the exclusive-OR product of the most significant n–k bits, $[A_{k-1}, A_{k-2}, \ldots, A_{2k-n}]$, of the least significant k bits of the address word and the most significant n–k bits, $[A_{n-1}, A_{n-2}, \ldots, A_k]$, of the address word. Turning it around, this product can be expressed as the exclusive-OR combination of the most significant n–k bits, $[A_{n-1}, A_{n-2}, \ldots, A_k]$, of the address word and the next-most significant n–k bits, $[A_{k-1}, A_{k-2}, \ldots, A_{2k-n}]$, of the address word. The selection of the most significant and the next-most significant n–k bits, was made for purposes of illustration only.

It should be understood that other combinations of the bits can be used to yield a set of data that will satisfy the goal of distinguishable data. For example, one could choose to combine a different subset of n–k bits of the least significant k bits of the address word, in any order, with the n–k most significant bits of the address word. Therefore, $$D_A' = [A_{k-4}, A_{k-5}, \ldots, A_{2k-n-3}] \oplus [A_k, A_{k+1}, \ldots, A_{n-1}]$$

and, assuming again that k=8 and n=13, then $$D_A' = [A_4, A_3, A_2, A_1, A_0] \oplus [A_8, A_9, A_{10}, A_{11}, A_{12}]$$

and $$D_A' = [A_4 \oplus A_8, A_3 \oplus A_9, A_2 \oplus A_{10}, A_1 \oplus A_{11}, A_0 \oplus A_{12}]$$

The remaining bits are used to form $D_B'$:

$$D_B' = [A_7, A_6, A_5]$$

The two are combined to yield:

$$D' = D_A':D_B'$$

or $$D' = [A_4 \oplus A_8, A_3 \oplus A_9, A_2 \oplus A_{10}, A_1 \oplus A_{11}, A_0 \oplus A_{12}]:[A_7, A_6, A_5]$$

or $$D' = [A_4 \oplus A_8, A_3 \oplus A_9, A_2 \oplus A_{10}, A_1 \oplus A_{11}, A_0 \oplus A_{12}, A_7, A_6, A_5]$$

It should be understood that $D_A'$ and $D_B'$ could be reversed.

Other bit combinations are similarly possible. In the most general case, the data word may consist of the exclusive-OR combination of any two mutually-exclusive groups of n–k non-repeating bits of the address word combined with the remaining 2k–n bits of the address word. The actual placement of the individual bits of $D_B$ relative to the elements of $D_A$ is irrelevant as long as the this placement is observed over the entire memory. For example, again assuming that k=8 and n=13, the following would be valid. The address word can be represented as follows:

$$A = [A_{n-1}, A_{n-2}, A_{n-3}, \ldots, A_0]$$

Using the general rule of this algorithm, an arbitrary set of n–k bits are combined with an equal number of bits arbitrarily selected from the remaining k bits of the address word, leaving 2k–n bits, which are combined with the exclusive-OR product of the two sets of n–k bits. One such possible grouping could be as follows:

$$D_A'' = [A_{n-2}A_{n-4}, A_{n-6}, A_{n-8}, A_{n-10}] \oplus [A_{n-3}, A_{n-5}, A_{n-7}, A_{n-9}, A_{n-11}],$$

or $$D_A'' = [A_{n-2} \oplus A_{n-3}, A_{n-4} \oplus A_{n-5}, A_6 \oplus A_{n-7}, A_{n-8} \oplus A_{n-9}, A_{n-10} \oplus A_{n-11}]$$

and $$D_B'' = [A_{n-1}, A_{n-12}, A_{n-13}]$$

Combining the two, $$D'' = [A_{n-2} \oplus A_{n-1}, A_{n-1}, A_{n-4} \oplus A_{n-5}, A_{n-6} \oplus A_{n-7}, A_{n-12}, A_{-8} \oplus A_{n-9}, A_{n-10} \oplus A_{n-11}, A_{n-13}]$$

and inserting actual bit numbers:

$$D'' = [A_{11} \oplus A_{10}, A_{12}, A_9 \oplus A_8, A_7 \oplus A_6, A_1, A_5 \oplus A_4, A_3 \oplus A_2, A_0]$$

Other variations of the algorithm could also be used.

It should be recognized that the general case can be expanded even further by permitting operands of $D_A$ having a bit-length greater than n–k, e.g., n–k+1 or, more generally, n–k+m, up to $\lfloor n \div 2 \rfloor$, where $\lfloor n \div 2 \rfloor$ is the largest whole-number not greater than n÷2, leaving n–2(n–k+m)=2k–n–2m unused bits. To fill out the k-bit data word, k–(n–k+m)= 2k–n–m additional bits are required. These are obtained by combining the 2k–n–2m unused bits with m bits randomly-selected from the $D_A$ operands to create the 2k–n–m bits of $D_B$. Since the m bits are used twice in the dataword, $D_B$ is not mutually exclusive with respect to the bits comprising the operands of $D_A$. Thus, the general case can now be stated as $D''' = D_A''' : D_B'''$, where $D_A'''$ is the exclusive-OR product of any two mutually-exclusive groups of bits having a bit-length ranging from n–k+m up to the largest whole-number not greater than n÷2, and $D_B'''$ comprises the remaining 2k–n–2m unused bits combined with m bits randomly-selected from the $D_A'''$ operands, where m may have a value ranging from 0 to the value of $k - \lfloor n \div 2 \rfloor$.

To check for stuck-at-1 and stuck-at-0, the test of the memory is run twice, once with a preset pattern generated by the algorithm described above and then again with the 1's complement of the pattern generated by the algorithm. Referring to FIG. 1, each of the addressable 4-bit locations (e.g., 0 to 31 or, as in the examples used, 0 to $2^{13}-1$) to be tested would be addressed (generally all unless a subset is desired), the data generated and written to the memory, and then afterwards the data would be read back and checked for accuracy.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method for testing a plurality of memory locations in a memory, each of said memory locations storing k bits of data and being addressed by an n bit address word, n being greater than k and having a maximum value of twice the value of k, said method comprising the following steps:

selecting a first set of n minus k bits of the address word to form a first group of address bits and a second set of n minus k bits of the address word to form a second group of address bits, wherein said first set of address bits and said second set of address bits are mutually-exclusive;

selecting the remaining bits of the address word to form a third group of address bits;

for each of said memory locations, performing the following step:

generating a k bit data word for said memory location, wherein said step of generating said data word further comprises the steps of:

combining said first group and said second group of address bits by an exclusive-OR operation to form a fourth group of n minus k address bits; and combining said third group and said fourth group of address bits to form said data word;

writing said data word into said memory locations; and reading back the contents of said memory locations to check for accuracy.

2. The method of claim 1, wherein said first group of address bits consists of the most significant n minus k bits of the address word.

3. The method of claim 2, wherein said second group of address bits consists of the most significant n minus k bits of the least significant k bits of the address word.

4. The method of claim 3, wherein said third group of address bits is combined with said fourth group of address bits by a concatenation operation.

5. The method of claim 4, wherein said data word is formed by concatenating said third group of address bits to the end of said fourth group of address bits.

6. The method of claim 1, wherein said memory consists of said plurality of memory locations.

7. A method for testing a plurality of memory locations in a memory, each of said memory locations storing k bits of data and being addressed by an n bit address word, n being greater than k and having a maximum value of twice the value of k, said method comprising the steps of:

selecting a first set of n minus k plus m bits of the address word to form a first group of address bits and a second set of n minus k plus m bits of the address word to form a second group of address bits, wherein said first set of address bits and said second set of address bits are mutually exclusive and wherein m has a minimum value of 0 and n minus k plus m has a maximum value equal to the largest whole-number not greater than n divided by 2;

combining the remaining bits of the address word with m bits randomly-selected from said first and second sets of address bits to form a third group of address bits;

for each of said memory locations, performing the following step:

generating a k bit data word for said memory location, wherein said step of generating said data word further comprises the steps of:

combining said first group and said second group of address bits by an exclusive-OR operation to form a fourth group of n minus k plus m address bits; and combining said third group and said fourth group of address bits to form said data word;

writing said data word into said memory locations; and reading back the contents of said memory locations to check for accuracy.

* * * * *